(12) United States Patent
Chai et al.

(10) Patent No.: US 6,556,466 B2
(45) Date of Patent: Apr. 29, 2003

(54) METHOD AND STRUCTURE FOR A CAMRAM CACHE MEMORY

(75) Inventors: Chiaming Chai, Durham, NC (US); Jeffrey Herbert Fischer, Cary, NC (US); Michael Thai Thanh Phan, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 09/842,953

(22) Filed: Apr. 26, 2001

(65) Prior Publication Data

US 2002/0159283 A1 Oct. 31, 2002

(51) Int. Cl.[7] .............................................. G11C 15/00
(52) U.S. Cl. ..................................... 365/49; 365/230.06
(58) Field of Search ............................... 365/49, 230.06

(56) References Cited

U.S. PATENT DOCUMENTS

| | | | |
|---|---|---|---|
| 4,523,301 A | | 6/1985 | Kadota et al. ................. 365/49 |
| 4,758,982 A | | 7/1988 | Price ........................... 364/900 |
| 4,766,568 A | | 8/1988 | McGregor et al. ............. 365/49 |
| 4,785,398 A | * | 11/1988 | Joyce et al. ................... 711/146 |
| 5,053,951 A | * | 10/1991 | Nusinov et al. ............... 711/206 |
| 5,226,009 A | * | 7/1993 | Arimoto ................... 365/189.04 |
| 5,239,642 A | * | 8/1993 | Gutierrez et al. .............. 365/49 |
| 5,305,262 A | | 4/1994 | Yoneda .................. 365/189.05 |
| 5,396,448 A | * | 3/1995 | Takayanagi et al. ........... 365/49 |
| 5,475,825 A | * | 12/1995 | Yonezawa et al. ............. 365/49 |
| 5,546,555 A | | 8/1996 | Horstmann et al. .......... 395/417 |
| 5,621,677 A | | 4/1997 | Jones ............................ 365/49 |
| 5,646,878 A | * | 7/1997 | Samra .................... 365/189.07 |
| 5,715,188 A | * | 2/1998 | Covino et al. ............... 365/201 |
| 5,949,696 A | | 9/1999 | Threewitt ..................... 365/49 |
| 6,041,389 A | * | 3/2000 | Rao ....................... 365/189.04 |
| 6,078,987 A | * | 6/2000 | Kongetira .............. 365/189.05 |
| 6,121,646 A | * | 9/2000 | Higuchi et al. .............. 257/213 |
| 6,128,697 A | * | 10/2000 | Mou ............................. 365/49 |
| 6,295,218 B1 | * | 9/2001 | Osada et al. ........... 365/189.05 |

* cited by examiner

Primary Examiner—Michael S. Lebentritt
Assistant Examiner—Tuan T. Nguyen
(74) Attorney, Agent, or Firm—Driggs, Lucas, Brubaker & Hogg; William N. Hogg

(57) ABSTRACT

An improved structure and method of operation are provided wherein a single RAM (random access memory) can be serviced by two CAMs (content addressable memory). This is accomplished by providing first actuating circuitry operably associated with and operatively connecting a first CAM to a selected portion of the RAM and second actuating circuit associated with and operably connecting a second CAM to a second portion of the RAM. The first actuating circuitry includes circuitry to actuate a selected wordline responsive to a CAM search read and RAM search read and circuitry to initiate a CAMRAM index read and index write operably responsive to given control logic. The second circuitry includes circuitry to actuate a selected wordline responsive to a CAM search read and RAM search read responsive to given control logic.

12 Claims, 6 Drawing Sheets

METHOD AND STRUCTURE FOR A CAMRAM CACHE MEMORY

BACKGROUND INFORMATION

This invention relates to a CAMRAM (content addressable memory random access memory) cache memories and, more particularly, to a structure and method that allows at least two CAM memories to be associated with a single RAM memory. With the increasing size of memory elements, along with the requirement of faster access time and smaller available areas on ASIC (Application Specific Integrated Circuit) chips, improved architecture of the CAMRAM base design is desired to address these issues effectively.

SUMMARY OF THE INVENTION

According to the present invention, an improved structure and method of operation are provided wherein a single RAM (random access memory) can be serviced by two CAMs (content addressable memory). This is accomplished by providing first actuating circuitry operably associated with and operatively connecting a first CAM to a selected portion of the RAM and second actuating circuit associated with and operably connecting a second CAM to a second portion of the RAM. The first actuating circuitry includes circuitry to actuate a selected wordline responsive to a CAM search read and RAM search read and circuitry to initiate a CAMRAM index read and index write operably responsive to given control logic. The second circuitry includes circuitry to actuate a selected wordline responsive to a CAM search read and RAM search read responsive to given control logic.

DESCRIPTION OF THE PREFERRED EMBODIMENT

Figure 1:
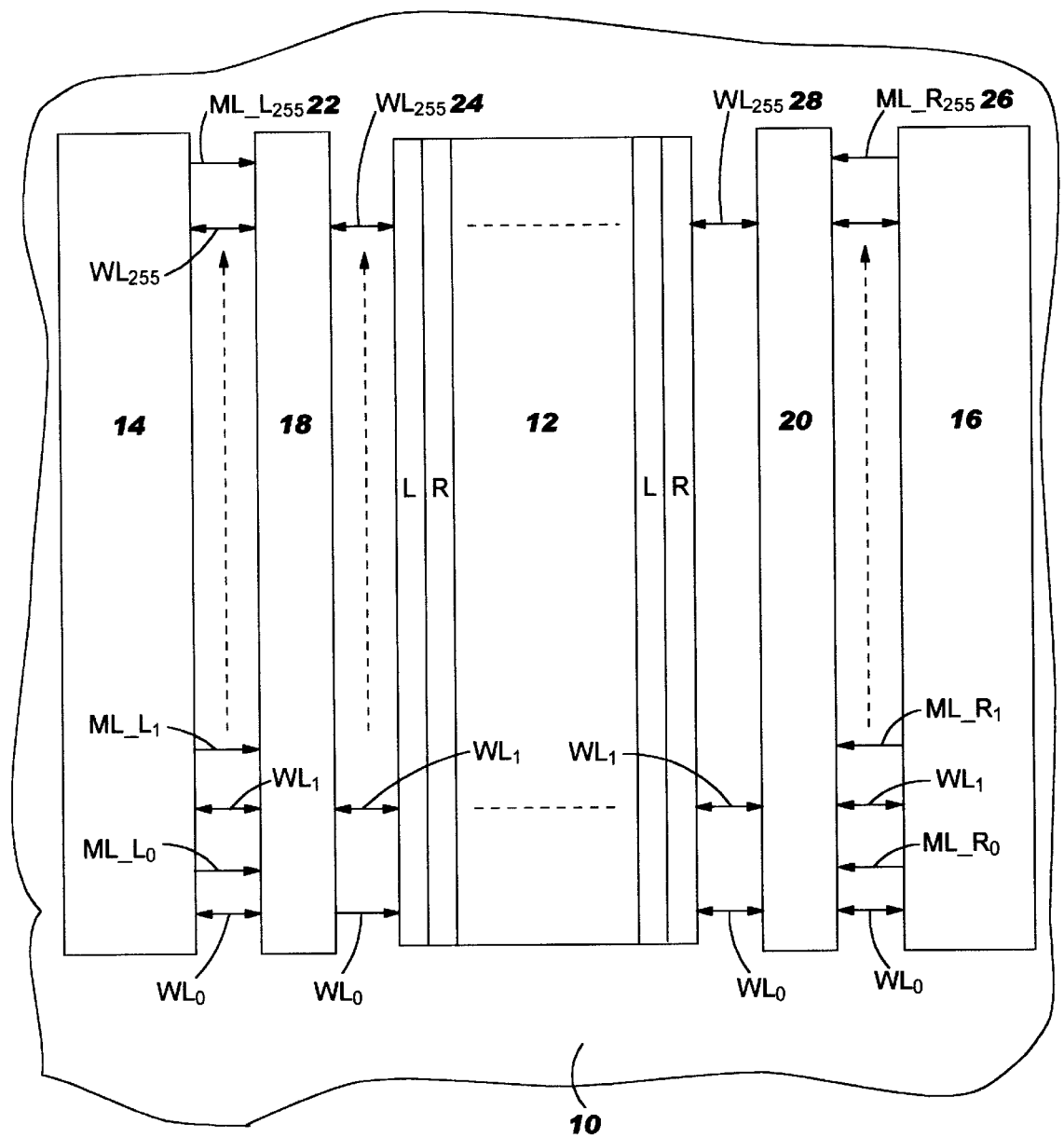
FIG. 1 is a block diagram showing the design interfaces between a CAMRAM structure wherein there is a single RAM and two CAMs.

Referring now to the drawings and, for the present, to FIG. 1, a block diagram showing a CAMRAM (content addressable memory random access memory) structure on an ASIC (application specific integrated circuit) chip 10 is shown incorporating the interface between CAM and RAM structures according to this invention. The CAMRAM structure includes a RAM (random access memory) 12 which is divided into a series of columns, some of which are accessible from the left, and some of which are accessible from the right, as shown in FIG. 1. The columns are designated L (left) and R (right). According to the present invention, only a single RAM 12 is provided, whereas two CAMs, CAM_L 14 and CAM_R 16, are provided which are configured to address, respectively, the left columns L of the RAM 12 and the right columns R of the RAM 12. The RAM 12 and CAMs 14 and 16 are of conventional design and operate in a conventional manner and, hence, the detailed operation of these is not deemed necessary.

Decoder and wordline driver 18 is provided to interface between the CAM_L 14 and the left columns L of the RAM 12, and a wordline driver 20 is provided to interface between the CAM_R 16 and the right columns R of the RAM 12. The decoding portion of the circuit 18 also operates on CAM_R 16, as will be explained presently. The decoder and wordline driver 18 and wordline driver 20 are configured to function according to the present invention.

As is conventional in a CAMRAM design, there are a plurality of wordlines and a plurality of match lines which are configured to interface between the CAM_L 14 and CAM_R 16 and the RAM 12. In the present invention, the match lines interface between the CAM_L 14 and the decoder and wordline driver 18 on one side and between CAM_R 16 and the wordline driver 20 on the other side. There are also a plurality of wordlines which also interface between CAM_L 14 on the left side and the RAM 12 through the decoder and wordline driver 18 on the left side and wordlines that interface between the CAM_R 16 and the RAM 12 to the wordline driver 20 on the right side. Conventionally, there are a plurality of match lines and wordlines corresponding to the number of addresses. In one conventional configuration, there are 256 wordlines and the same number of match lines. The match lines for the CAM_L 14 and the decoder wordline driver 18 are indicated as match line $ML\_L_0$–$ML\_L_{255}$ 22, and the wordlines between the CAM_L 14 and the RAM 12 are designated as wordlines $WL\_L_0$–. . . $WL\_L_{255}$ 24 on the left side. On the right side, there are match lines $ML\_R_0$–$ML\_R_{255}$ 26, and wordline $WL\_R_0$–$WL\_R_{255}$ between the CAM_R 16 and wordline driver 20. Thus, the decoder and wordline driver 18 operates to find a match line if one exists for the CAM_L 14 and, similarly, wordline driver 20 operates to find a wordline or match line if one exists for the CAM_R 16.

Figure 2:
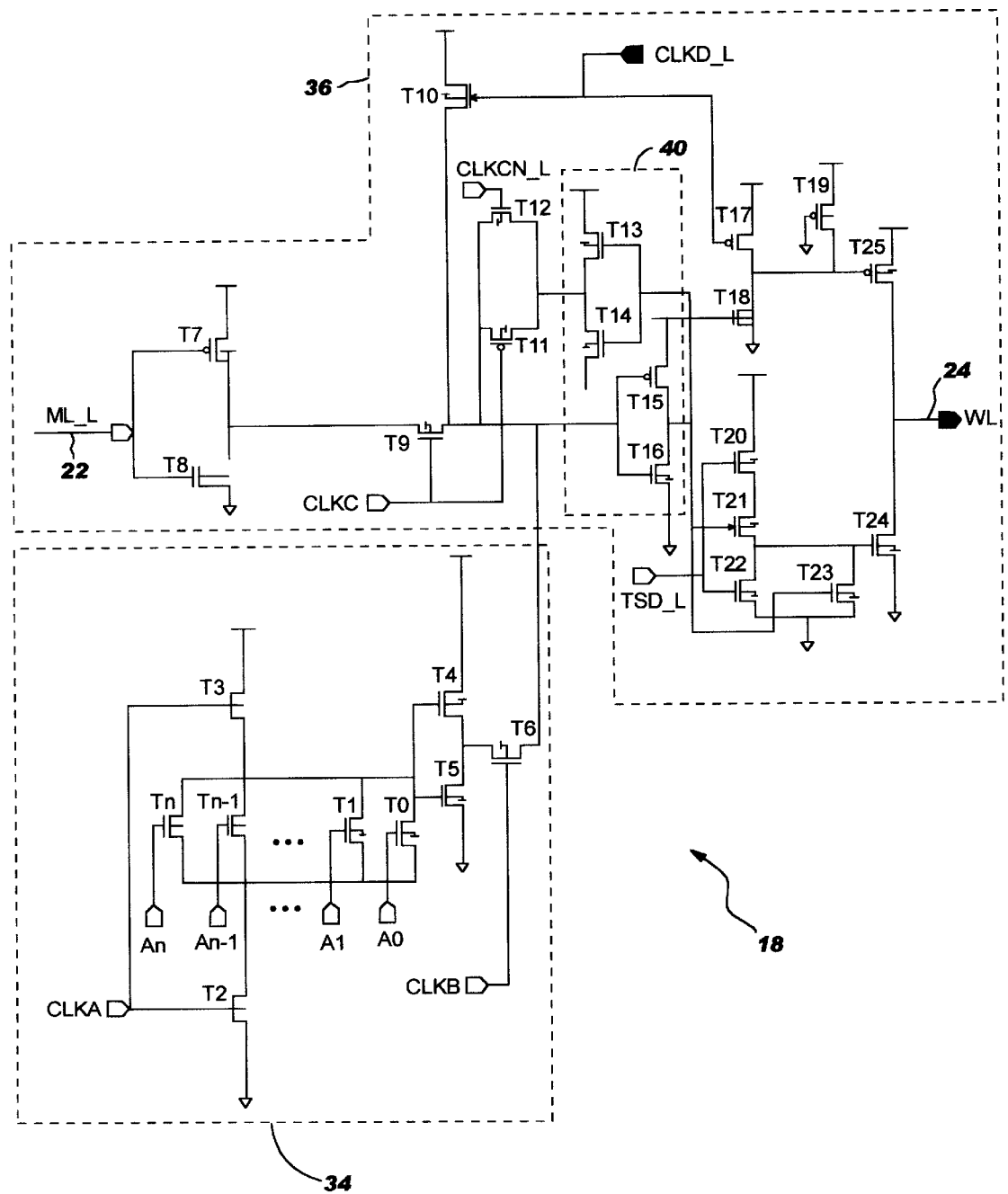
FIG. 2 is a detailed circuit diagram of the decoder and a tristateable wordline driver on the left side of FIG. 1, associating the CAM_L with memory elements on the left columns of the RAM.
Figure 3:
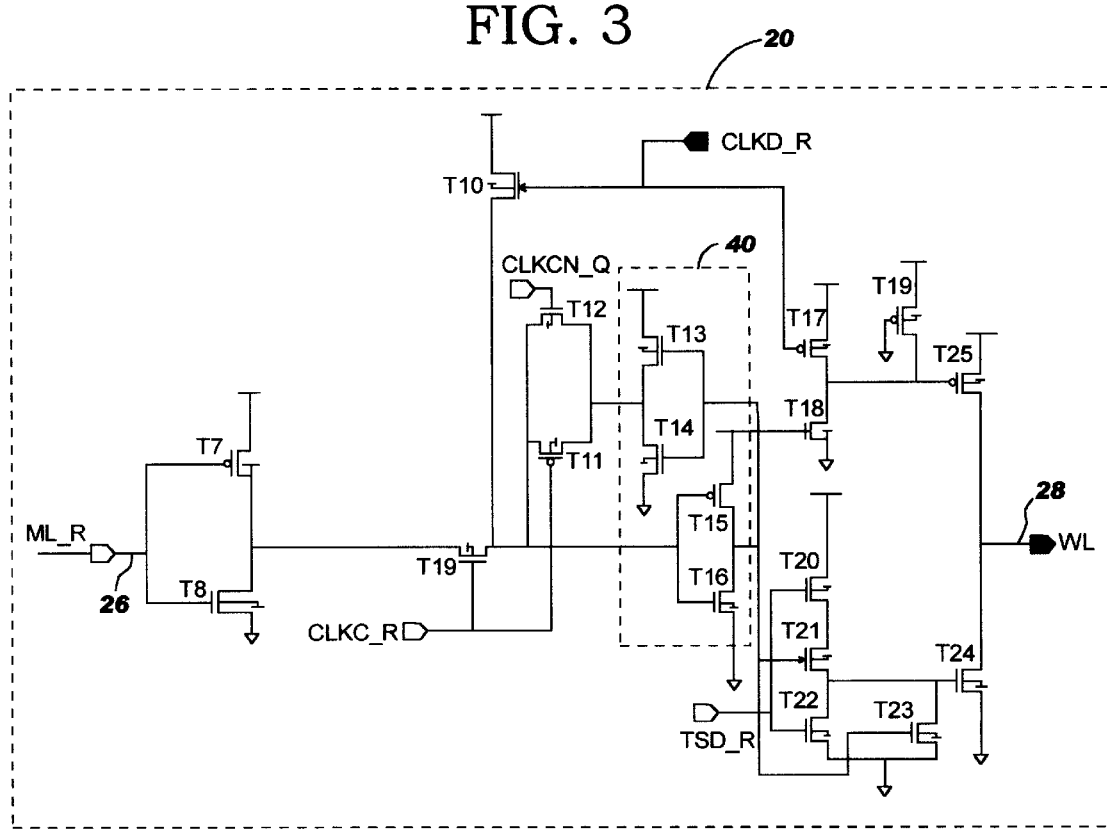
FIG. 3 is a detailed circuitry of the tristate wordline on the right side of FIG. 1 as it associates the CAM_R with memory elements on the right column of the RAM.

FIGS. 2 and 3 each show one row of the decoder and wordline driver 18 and one line of the wordline driver 20, respectively. It is to be understood that there is similar circuitry for each wordline driver which, as indicated above, there must be the same number of wordline drivers as there are addresses. In one environment, a typical number of addresses is 256; thus, there will be 256 wordline drivers and, hence, 256 decoder and wordline driver circuits 18, as shown in FIG. 2, and 256 wordline driver circuits 20, as shown in FIG. 3. Moreover, when referring to match lines and wordlines, the terms "ML_L, ML_R and WL" are used without subscripts for clarity of explanation since they can refer to any one of individual wordline circuits.

Referring now to FIGS. 2 and 3, in FIG. 2 the decoder and wordline driver 8 for CAM_L 14 includes a decoder component 34 and a wordline driver component 36. FIG. 3 shows a circuit 20 having only a wordline driver component. The circuitry of the component 36 and circuit 20 are essentially identical, other than the inputs to actuate the circuitry. (The decoder circuit 34 is shown as a portion of the decoder and wordline driver 18. However, it is to be understood that this decoder 34 could just as easily be provided as a separate circuit or as a portion of the circuit 20 of FIG. 3.) The circuit components 34, 36 and 20 are formed of conventional transistors connected in a manner which will provide certain outputs responsive to selected inputs, as will be described presently, and the operation of the transistors in the circuit will be apparent to those skilled in the art. Also, it is not believed to be necessary to describe the operation of each transistor but, rather, the function of these circuits will be described in conjunction with the inputs thereto and the outputs thereof, and with reference to the timing diagrams shown in FIGS. 4–6.

When index read or write operation is gated, the input pins of the decoder 34, A0, A1 . . . An−1, An in FIG. 2, will receive a set of index addresses from the true and complement circuitry. As shown in FIG. 2, A0, A1 . . . An−1, An are the address inputs of the wordline decoder and they are gated by clock A (CLKA) and clock B (CLKB) which are clocks generated on the ASIC 12 from a system clock (not shown). ML_L 22 is the input signal from the compare circuitry of CAM_L 14. It determines whether there is a cache hit or miss during a CAM_L search read and RAM search read. This is also gated by clock left (CLKC_L). Clock signal left (CLKCN_L) is an inverted logic to CLKC_L clock which controls the feedback devices of a hold latch, including transistors $T_{13}$, $T_{14}$, $T_{15}$ and $T_{16}$, collectively 40, so that they are in an off state during the CAM_L search read and RAM search read and in hold state when CAM_L search read and RAM search read is in off state in general. Clock signal CLKD_L acts as a wordline restore and tristate enable. TSD_L is a tristate enable control signal. For the similar reason as above, ML_R, CLKC_R, CLKCN_R, CLKD_R and TSD_R are the clocks and controls in FIG. 3. A logic control also is built in to guarantee that TSD_L in FIG. 2 and TSD_R in FIG. 3 are always in opposite states so that the wordlines are never floating and are forced to logic zero when they are unused. All of the clock signals referred to herein are generated on the ASIC chip from clock signals generated by the system clock (not shown).

CAMRAM INDEX READ OR WRITE OPERATION

An index read or write operation need not be specific to CAM_L 14 or CAM_R 16 and, thus, only one decoder circuit need be used which, as indicated above, is contained as a part of the circuit 18 connected to CAM_L 14. When an index read or write operation is gated, the input pins of the decoder A0, A1 . . . An−1, An in FIG. 2 will receive a set of index addresses from the true and complement circuitry. Only one of this circuitry is selected when all A0, A1 . . . An−1, An contain a logic zero. In the meantime, CLKA, CLKB, each of which are decoder clocks, CLKC_L, CLKCN_L, each of which are CAM match clocks, CLKD_L, a restorer clock, TSD_L, which is a tristate enable content clock, are generated from clock and control logic. CLKC_R, CLKCN_R, CLKD_R and TSD_R in FIG. 3 are the same as the_L clocks in FIG. 2.

Figure 4:
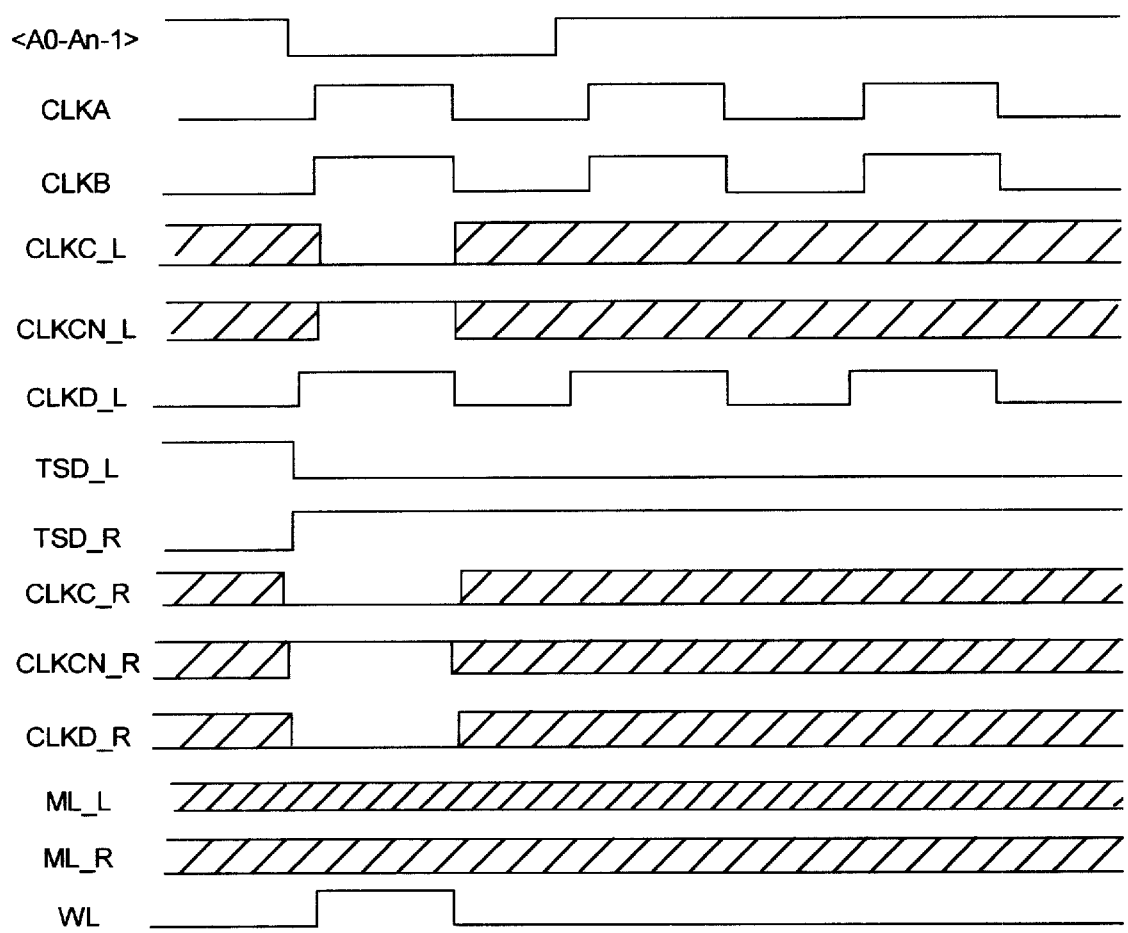
FIG. 4 is a timing diagram of the circuitry of FIGS. 2 and 3 for the case of read or write for both CAMs and RAM for an index search.

CLKA and CLKB will gate the index addresses to the wordline portion circuitry 36 through transistors T2, T3 and T6 in FIG. 2. The clock and control logic detects this in an index read or write operation. Therefore, CLKC_L and CLKC_R are set to a logic zero that forces transistor T9 in FIG. 2 and T9 in FIG. 3 to an off state. CLKD_L is switched to a logic one which turns off transistors T10 and T17 in FIGS. 2 and 3, and CLKCN_L is also a logic one, so that the hold latch 40 is enabled to hold wordline data that was passed on from the address decoder 34. TSD_L is enabled low so that it allows the wordline data to get passed onto the wordline driver in FIG. 2 to the CAM_L 14, RAM 12 and CAM_R 16. Meanwhile, the CLKD_R remains at logic zero and TSD_R is switched to a disable high. These two signals turn off both transistors T25 and T24 and lead the WL output of FIG. 3 to a hi-Z or tristate. With the appropriate controls, one can either perform index read or write for CAM_L and left column L of RAM 12 or CAM_R and right column R of RAM 12, but not both. FIG. 4 shows the timing diagram of this case. In this timing diagram, as in all of the timing diagrams, the addresses are active low and all of the clocks and wordlines are active high. The hatched areas indicate times when it does not matter whether the clock or line or address is active or not active.

CAM_L SEARCH READ AND RAM SEARCH READ

Figure 5:
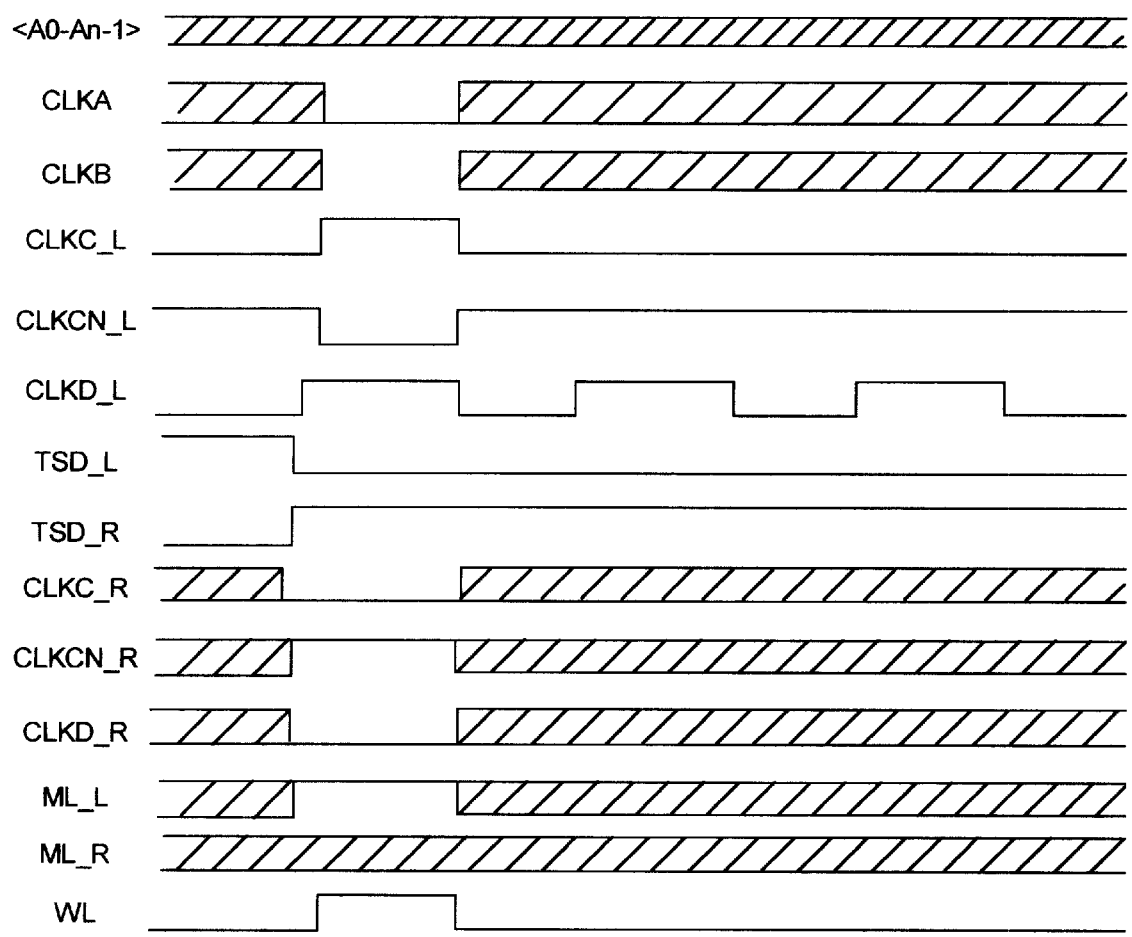
FIG. 5 is a timing diagram of the circuitry of FIG. 2 and FIG. 3 for a CAM_L search read and RAM search read.

When a CAM_L search read and RAM search is specific to the CAM_L 14 and the left hand columns L of the RAM 12, this must be performed with the CAM_L with the CAM_R 16 in a hi-Z state. When the CAM_L 14 read and RAM search read is gated, the clock and control logic will set CLKA and CLKB to a logic zero. This isolates the decoder 34 from the wordline driver portion 36 of the circuit in FIG. 2. CLKCN_L is set to logic one, so that it will pass the hit or miss data from ML_L 22 of CAM_L 14 to the wordline driver 36 through transistor T9, and since CLKCN_L is always in opposite state to CLKC_L, it will, therefore, turn off transistors T11 and T12 in FIG. 2 to prevent any feedback from the hold latch 40. This will improve the performance of the hit or miss data ML_L 22 signal passed to the decoder and wordline driver 18. Similar to case 1, CLKD_L is switched to a logic one. This turns off transistors T10 and T17 and TSD_L is enable low, so that it allows the hit or miss data from CAM_L to get passed onto the wordline driver in FIG. 2 and to the RAM. In case of a miss, ML_L is at logic zero; therefore, WL will be off, so there is no RAM search read actuated. On the other hand, in case of a hit, ML_L will be at logic one; therefore, WL will be on, then RAM search read will be actuated. Meanwhile, in FIG. 3, the CLKC_R is set to a logic zero so that it will isolate the hit or miss data ML_R 26 of CAM_R 16 and the CLKD_R remains at logic zero, and TSD_R is switched to disable high. These two signals turn off both transistors T25 and T24 and lead the WL output of FIG. 3 to a hi-Z state. FIG. 5 shows a timing diagram of this case when there is a hit.

CAM_R SEARCH READ AND RAM SEARCH READ

Figure 6:
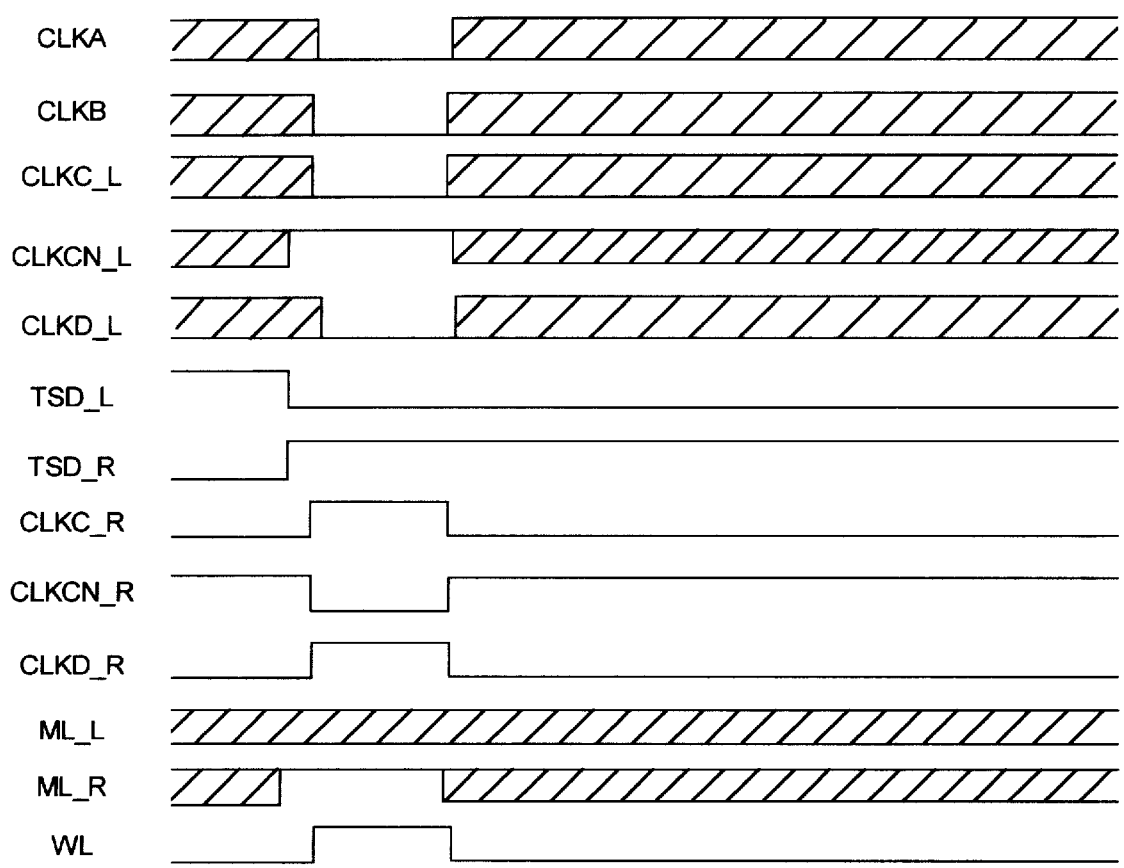
FIG. 6 is a timing diagram of the circuitry of FIGS. 2 and 3 for the case of the CAM_R search read and RAM search read.

When a CAM_R 16 search read and RAM 12 search read are gated, the clock and control logic will set CLKA and CLKB and CLKC_L to a logic zero. This isolates the address decoder 34 and the hit or miss data ML_L 22 of CAM_L 14 to the decoder and wordline driver 18 through transistors T6 and T9 in FIG. 2, and CLKD_L remains at logic zero and TSD_L is switched to a logic one. This turns off both transistors T25 and T24 and leads the WL output of FIG. 2 to a hi-Z state. Meanwhile, in FIG. 3, the CLKC_R is set to logic one, so that it will pass the hit or miss data from ML_R 26 of CAM_R 16 to the wordline driver 20 through transistor T9. Again, since CLKCN_R is always in opposite state to CLKC R, it will turn off transistors T11 and T12 in FIG. 3 to prevent any feedback from the hold latch. This will improve the performance of the hit or miss data ML_R 26 signal passed to the wordline driver 20. CLKD_R is switched to a logic one. This turns off transistors T10 and T17 and TSD-R is enabled low, so that it allows the hit or miss data from CAM_R 16 to get passed onto the wordline driver in FIG. 3 and to the RAM. In case of a miss, ML_R is at logic zero; therefore, WL will be off, so there is no RAM search read actuated. On the other hand, in case of a hit, ML_R will be at logic one; therefore, WL will be on, then RAM search read will be actuated. FIG. 6 shows a timing diagram for this case when there is a hit.

With this configuration, only one address decoder is required for two CAMs plus a RAM. Moreover, when a CAM search read and RAM search read is performed, the same RAM I/O's can be used. Thus, there is a saving of area required by the use of two CAMs and a single RAM.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A CAMRAM structure associated with a processor comprising:
   a single RAM and first and second CAMs;
   first actuating circuitry operatively connecting said first CAM to a selected portion of said RAM, and second actuating circuitry operatively connecting said second CAM to a second portion of said RAM;
   said first actuating circuitry including circuitry to actuate a first selected CAM search read and RAM search read responsive to a first selected control signal;
   said second actuating circuitry including circuitry to actuate a second selected CAM search read and RAM search read responsive to a second selected control signal; and
   circuitry to initiate a CAMRAM index read or write operational responsive to a selected third control signal.

2. The structure as defined in claim 1 wherein said circuitry to initiate a CAMRAM index read or write operation is a portion of said first actuating circuitry.

3. The structure as defined in claim 1 wherein said first selected control signal will tristate the output from said second actuating circuitry and said second control signal will tristate the output from said first actuating circuitry.

4. The structure as defined in claim 3 wherein each of said first and second actuate circuitry include latches.

5. The structure as defined in claim 1 wherein the control signals to actuate said first and second actuating circuits each include a clock signal.

6. The structure as defined in claim 5 wherein each clock signal includes both a true clock signal and a complement clock signal as each control signal.

7. A method of operating a CAMRAM cache memory comprising the steps of:
   providing a CAMRAM structure associated with a processor having a single RAM and first and second CAMs;
   providing first acing circuitry operatively connecting said first CAM to a selected portion of said RAM, and second actuating circuitry operatively connecting said second CAM to a second portion of said RAM;
   utilizing said first actuating circuitry to actuate a selected CAM search read and RAM search read responsive to a first selected control signal;
   utilizing said second actuating circuitry to actuate a selected CAM search read and RAM search read responsive to a second selected control signal; and
   initiating a CAM index read or write operation responsive to a selected third control signal.

8. The method as defined in claim 7 wherein circuitry to initiate a CAMRAM index read or write operation is a portion of said first actuating circuitry.

9. The method as defined in claim 7 wherein said first selected control signal will tristate the output from said second actuating circuitry and said second control signal will tristate the output from said first actuating circuitry.

10. The method as defined in claim 9 wherein each of said first and second actuating circuitry include latches.

11. The method as defined in claim 7 wherein the control signals to actuate said first and second actuating circuits each include a clock signal.

12. The method as defined in claim 11 wherein each clock signal includes both a true clock signal and a complement clock signal as each control signal.

* * * * *